United States Patent [19]
Vaynkof et al.

[11] Patent Number: 5,385,477
[45] Date of Patent: Jan. 31, 1995

[54] CONTACTOR WITH ELASTOMER ENCAPSULATED PROBES

[75] Inventors: Yakov F. Vaynkof, Woodland Hills; Karl F. Zimmermann, Agoura; Jerry W. Shorter, Camarillo; Joseph K. Bond, Newbury Park, all of Calif.

[73] Assignee: CK Technologies, Inc., Newbury Park, Calif.

[21] Appl. No.: 100,611

[22] Filed: Jul. 30, 1993

[51] Int. Cl.⁶ .............................. H05K 1/00
[52] U.S. Cl. .......................... 439/66; 439/591
[58] Field of Search ........ 439/65, 66, 91, 591, 439/481, 482, 74; 324/158 P, 158 F

[56] References Cited

U.S. PATENT DOCUMENTS

| | | | |
|---|---|---|---|
| 4,330,165 | 5/1982 | Sado | 439/91 |
| 4,506,215 | 3/1985 | Coughlin | 324/158 P |
| 4,931,726 | 6/1990 | Kasukabe et al. | 439/482 |
| 4,998,885 | 3/1991 | Beaman | 439/66 |
| 5,123,848 | 6/1992 | August et al. | 439/66 |

Primary Examiner—Larry I. Schwartz
Assistant Examiner—Hien D. Vu
Attorney, Agent, or Firm—Marvin E. Jacobs

[57] ABSTRACT

A buckling beam probe contactor in which an array of electrically conductive, parallel, probe test wires, are cast into a housing with urethane or silicone elastomer so as to elastically couple the wires to each other and cause all of the probe wires to bend and buckle in identical, parallel, congruent waveforms and thereby maintain spacing between the wires. Stiffer elastomers are used to insure that the wires have a greater number of inflections with less sideways displacement. Various modifications of the elastomer allow desired buckling patterns to be generated.

19 Claims, 7 Drawing Sheets

CONTACTOR WITH ELASTOMER ENCAPSULATED PROBES

TECHNICAL FIELD

This invention pertains to the field of electrically testing semiconductor devices by pressing a collection of probe wires against the devices at precise locations where the device usually has contact pads especially for this purpose. More specifically, a contactor probe assembly design is disclosed that allows the probe wires to be closer together to test denser contact pad arrangements.

BACKGROUND OF THE INVENTION

It is known in the prior art to test integrated circuit chips and the like by bringing an array of parallel wires into contact with numerous contact pads formed on the chips so as to make a reliable electrical connection therewith. This array of wires is called a probe contactor in the art. The pads may differ in height. Accordingly, the probes are allowed to bend or buckle a bit so that all the probes engage their corresponding pads with a good, solid, low resistance, contact force. Hence, the arrays are called buckling beam probe contactors.

One example of a buckling beam contactor is shown in U.S. Pat. No. 3,806,801 to Bove. The probe wires pass through the holes in a pair of perforated plates. The pair of perforated plates have holes in the correct positions to locate the array of probes so that they will contact the particular arrangement of pads on the chip to be tested. It may be necessary to use hundreds of parallel probe wires packed very close together. Thus, when the probes buckle, they may touch each other, interfering with the bending, or even shorting out. To avoid this problem, Bove insulates the probes and further offsets or slants the holes in the lower perforated plate to encourage all of the probe wires to buckle in the same horizontal direction.

Another buckling beam probe contactor is shown in U.S. Pat. No. 4,506,215 to Coughlin wherein a third intermediate perforated plate is used to induce a prebow in the probe beams. However, a centerpost is required to keep the top and bottom plates aligned and this centerpost severely limits the possible positions of the contact pads.

U.S. Pat. No. 4,843,315, to Bayer et al, shows a stack of perforated plates with myriad oblong holes to not only keep all of the probes isolated, but also to force multiple small bends in the probes so as to accommodate a greater range of pad heights with less total horizontal displacement. However, the extreme complexity of this structure, and the likelihood of a great deal of friction and rubbing in the holes is apparent, especially considering that hundreds of probes may be required, located only fractions of a millimeter apart. The probes could frictionally lock in one of the many holes and effectively become much shorter. This increases the contact force unpredictably which may damage the contact pads.

An entirely different approach may be seen in U.S. Pat. No. 4,932,883, to Hsia et al, where buckling beams are eliminated completely, and instead contact pads are substituted which rest on a springable elastomer to accommodate height differences. This approach does not allow a very dense array of contacts to be designed and the invention is really targeted more at the interconnection of integrated circuits with each other.

As integrated circuits become more and more complicated, with millions of circuits, while simultaneously shrinking in size, it is a necessity to have a probe contactor with very many probes very close together. This contactor should be more reliable than Bove, denser than Hsia et al and Coughlin, and much simpler than Bayer et al. The present invention achieves these objectives, and does so at a lower cost.

STATEMENT OF THE INVENTION

Briefly, this invention comprises a buckling beam probe contactor in which the probes are not forced into the desired curves by hard perforated plates, but rather gently and compliantly coupled to each other with an elastomer compound that is cast around and between all of the probe wires. The probes and elastomer form an integrated elastic system so that the bending of one probe encourages the bending of nearby probes in the same geometric configuration. The probes therefore remain parallel or congruent to each other as they buckle. Furthermore, the number of bends or waves in a given probe can be increased by selecting a stiffer elastomer. Stiffness is determined by the modulus of elastic foundation, a constant that is known for various formulations of elastomers. A larger number of bends in the probes permits a larger contact force for a given horizontal displacement of the probes. Less horizontal displacement permits a closer positioning of the probes, desirable for testing more compact circuit devices.

Another advantage of elastomer encapsulated probe arrays is that the pattern of bends in the array can be selected by locating hard points close to the array at certain places to increase resistance at those places. The probes then bend toward areas of lower resistance. Additional benefits and advantages are enumerated in the detailed description that follows and the drawings referenced thereby.

DETAILED DESCRIPTION OF THE INVENTION

Figure 1:
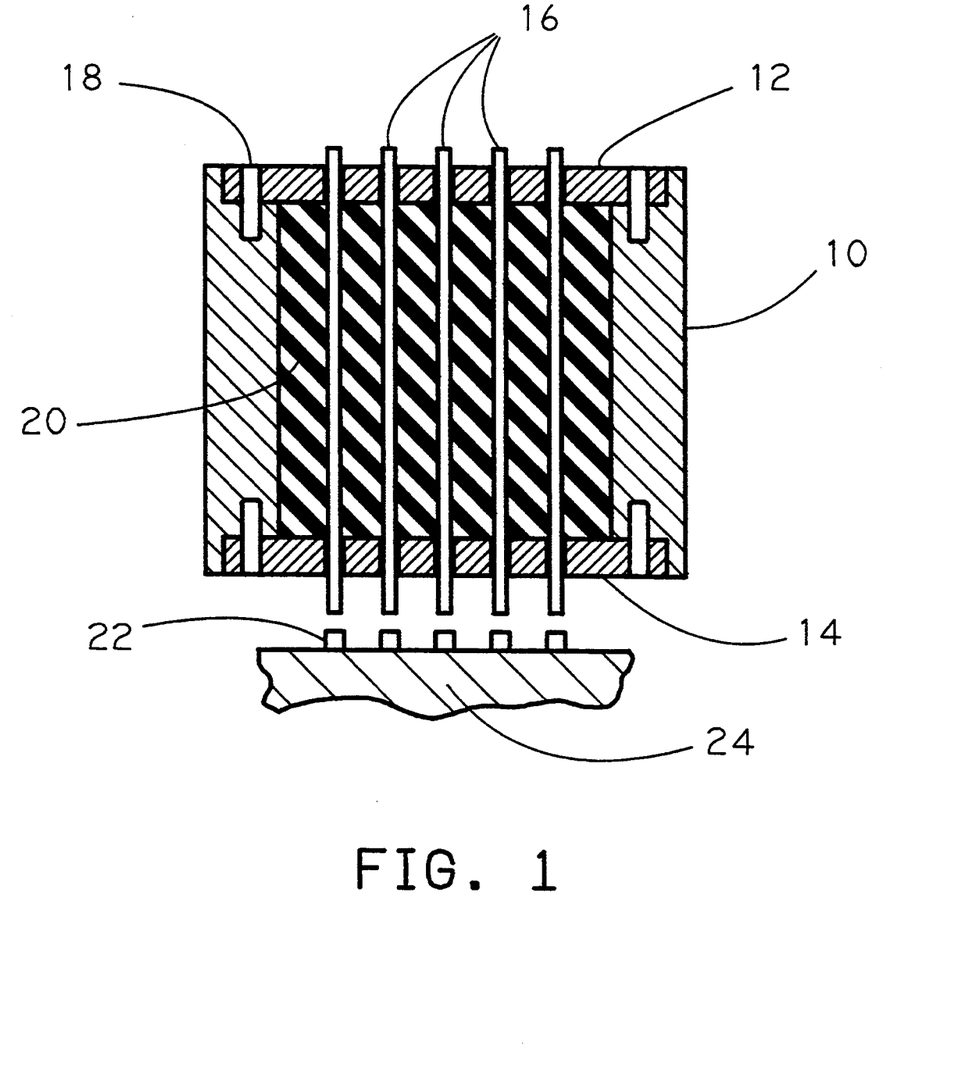
FIG. 1 is a schematic, sectional, elevational view of the elastomer encapsulated probe array of the present invention in the relaxed configuration.

The probe contactor of the present invention is shown in section in FIG. 1. A hollow housing 10 supports a top perforated plate 12 and a bottom perforated plate 14, with an identical pattern of holes to plate 12. A plurality of probe wires 16 extend through the holes in plates 12 and 14. Plates 12 and 14 are formed from a suitable dielectric plastic such as Delrin so as to electrically insulate probes 16. Screws or pins 18 fasten the plates to housing 10.

The pattern of holes in plates 12 and 14 matches the position of test contact pads 22 on an electronic device 24, which may comprise, for example, an integrated circuit. Housing 10 is lowered to press probes 16 against pads 22. Probes 16 are blocked from upward movement by an interface structure above plate 12 that is omitted from the drawing since it is well known to those skilled in the art. Each probe is electrically connected to the testing equipment at the interface structure.

Figure 2:
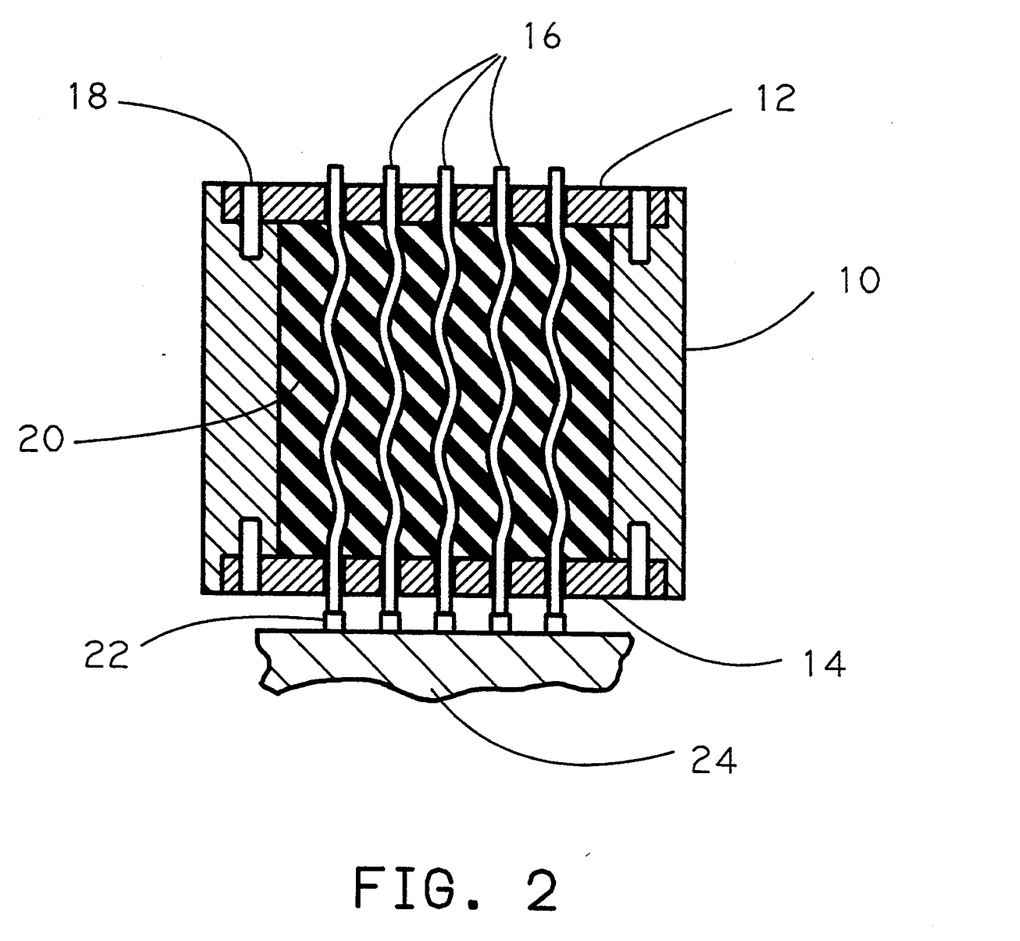
FIG. 2 is the same view as FIG. 1 but with the probes pressed against contact pads showing how the probe wires buckle in the same directions and patterns due to the elastic coupling of the encapsulating elastomer.

Probes 16 are surrounded, immersed, and fully encapsulated by an elastic probe coupling material 20 that allows the probes to move and buckle individually, but also transmits enough force from one probe to adjacent probes so that all the probes are induced to bend at the same places and in the same direction. Probe coupling material 20 should be a castable dielectric elastomer such as silicone or urethane compounds. These compounds may be poured into housing 10 and allowed to cure. After curing, probes 16 and elastomer 20 comprise a composite material with new and unique physical characteristics. The elastomer controls the buckling of the probes. The elastomer resists horizontal displacement, and the resistance increases with displacement. Hence, the probes must assume a series of small waves as shown in FIG. 2. Stiffer elastomers create more inflection points and more waves or bends.

As one probe moves toward an adjacent probe, it compresses elastomer 20 at that location, making the elastomer locally stiffer. Thus, the adjacent probe is induced to bend away from the stiffer elastomer at that location as it tries to buckle. This coupling effect propagates throughout the composite material so that all of the probes assume parallel and congruent bends as shown in FIG. 2. Therefore, the introduction of elastomer 20 allows one to select the number of waves in the probes, and consequently the horizontal displacement of the probes. At the same time, elastomer 20 operates to align and coordinate all of the probes in parallel and identical shapes so that the spacing between the probe wires remains essentially constant. As a result, a contactor may be designed with the probes as close together as desired in order to test new generations of circuit devices with hundreds of contact pads very densely packed and very close together. At the same time, the probes 16 are capable of considerable vertical adjustment for different height pads 22 while still maintaining good contact force and low electrical resistance.

The composite material formed from elastomer 20 and parallel probes 16 is an elastic system that behaves in accordance with the theory of the buckling of a column on an elastic foundation. Knowing the desired contact force, the modulus of elasticity of the probe metal, and its cross sectional area and length, it is possible to calculate the number of inflection points in the probes as a function of an elastomer constant called the modulus of the elastic foundation. If it is desired to position the probe wires a certain distance apart, the modulus of elastic foundation is selected to provide a stiff enough elastomer to generate a sufficient number of waves in the probes to keep the horizontal deflections well within the certain distance desired. The silicone or urethane elastomer is then formulated to have the needed modulus of elastic foundation.

Clearly the elastomer is a much simpler and more reliable way of inducing the desired buckling in the probes than stacks of perforated plates. Furthermore, very fine and delicate probe wires can be used, positioned very close together, so as to engage very small and densely packed contact pads. For a given probe diameter and elasticity, the desired contact force may be achieved by selecting an elastomer of suitable stiffness. Casting elastomer is much less expensive than fabricating large numbers of perforated plates with specially shaped holes to induce bends mechanically, as proposed by the prior art. Plates 12 and 14 require only circular holes.

To accommodate contact pads of different heights, without changing the diameter of the probes, the probes can be made more adaptable simply by increasing their length to allow more buckling waves. This costs virtually nothing with elastomer encapsulation, but would be very expensive with additional perforated plates for each additional wave.

Figure 3:
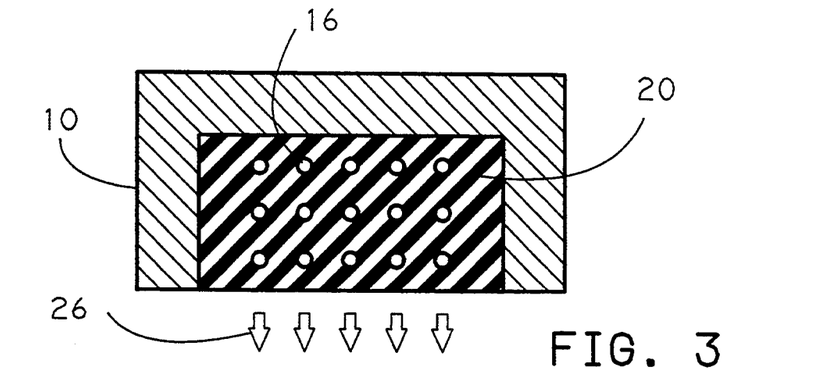
FIG. 3 is a schematic sectional view showing how the probe wires tend to deflect toward the part of the elastomer that is unrestrained.
Figure 4:
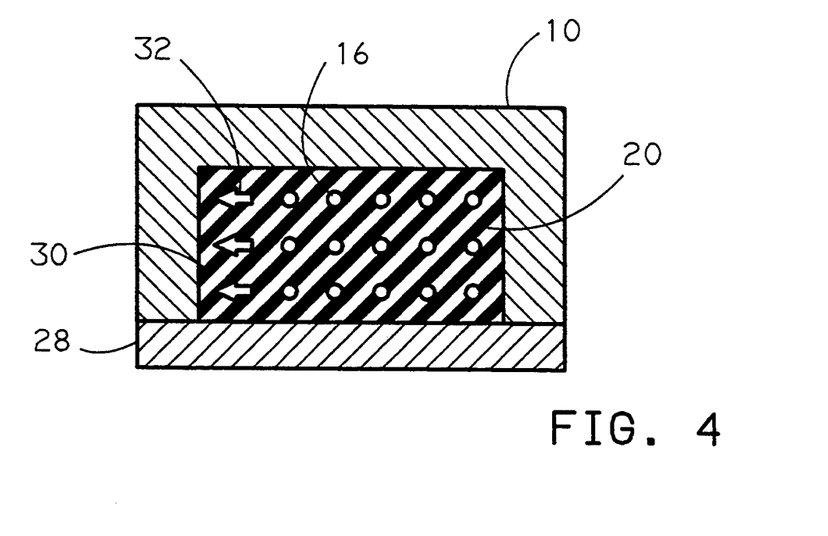
FIG. 4 is similar to FIG. 3 but showing how the probe wires tend to deflect toward areas of more elastomer when otherwise equally restrained.
Figure 5:
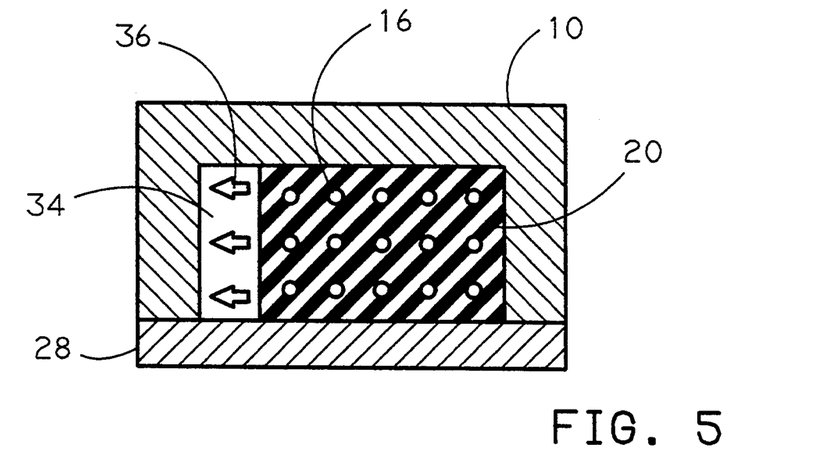
FIG. 5 is like FIG. 4 and shows how the probe wires will bend toward voids in the elastomer when compressed from the ends.

Not only can the probes be kept parallel with elastomer encapsulation in accordance with the principles of this invention, but the exact locations of the waves can be externally induced as shown in FIGS. 3-9. In general, the probes will horizontally deflect in the direction of least resistance. If one side of housing 10 is open, as shown in FIG. 3, probes 16 move toward the opening, as shown by arrows 26. In FIG. 4, a cover 28 closes the open side, but additional elastomer 30 is provided between the probes and the left wall. Hence, the probes bend toward the less resistant elastomer as shown by arrows 32. In FIG. 5, a void 34 yields the same result as extra elastomer causing buckling in the direction of arrows 36. The simple modifications of FIGS. 3-5 are useful when the probe columns are expected to have only one bend in one direction.

Figure 6:
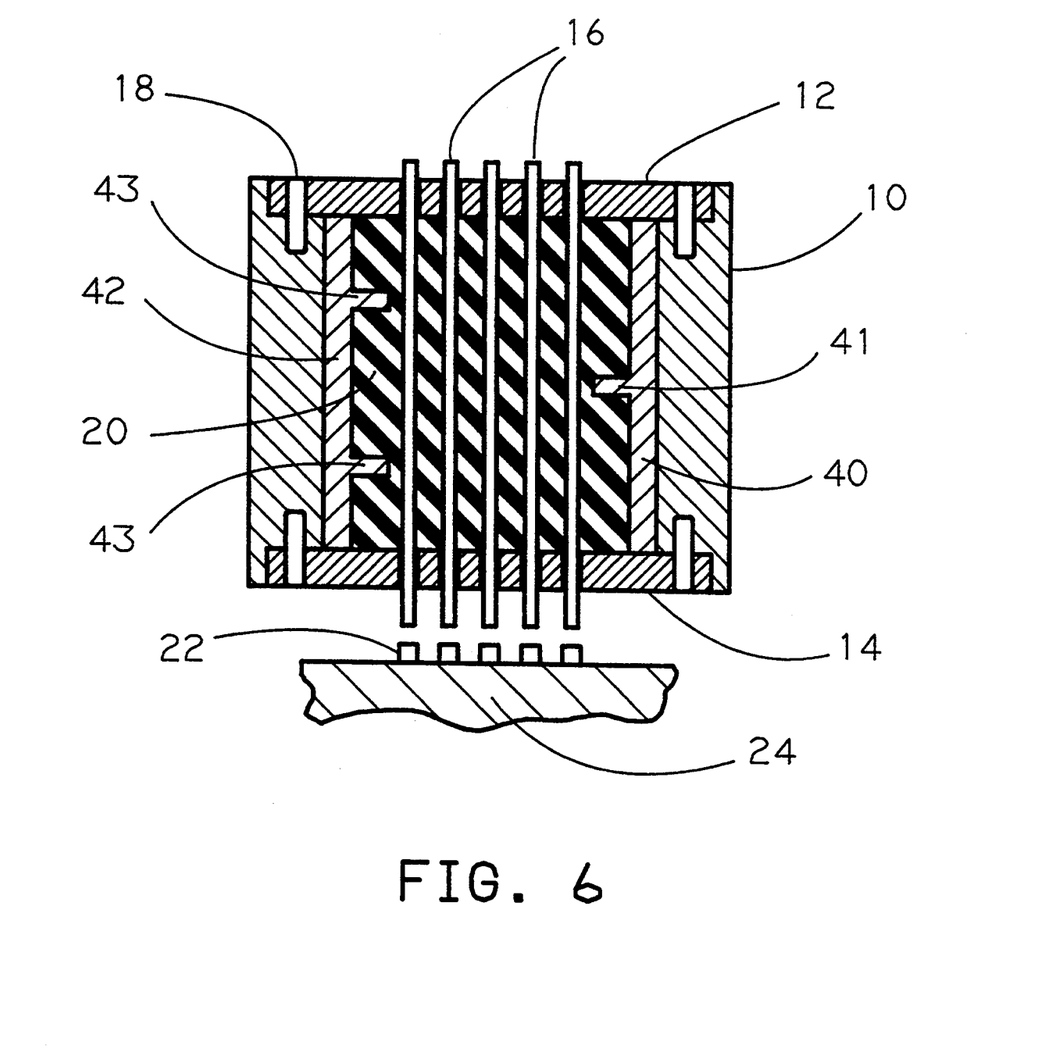
FIG. 6 is similar to the elevational section of FIG. 1 but includes plastic inserts to position compression resistant hard points at desired locations so as to induce desired shapes of buckling.
Figure 7:
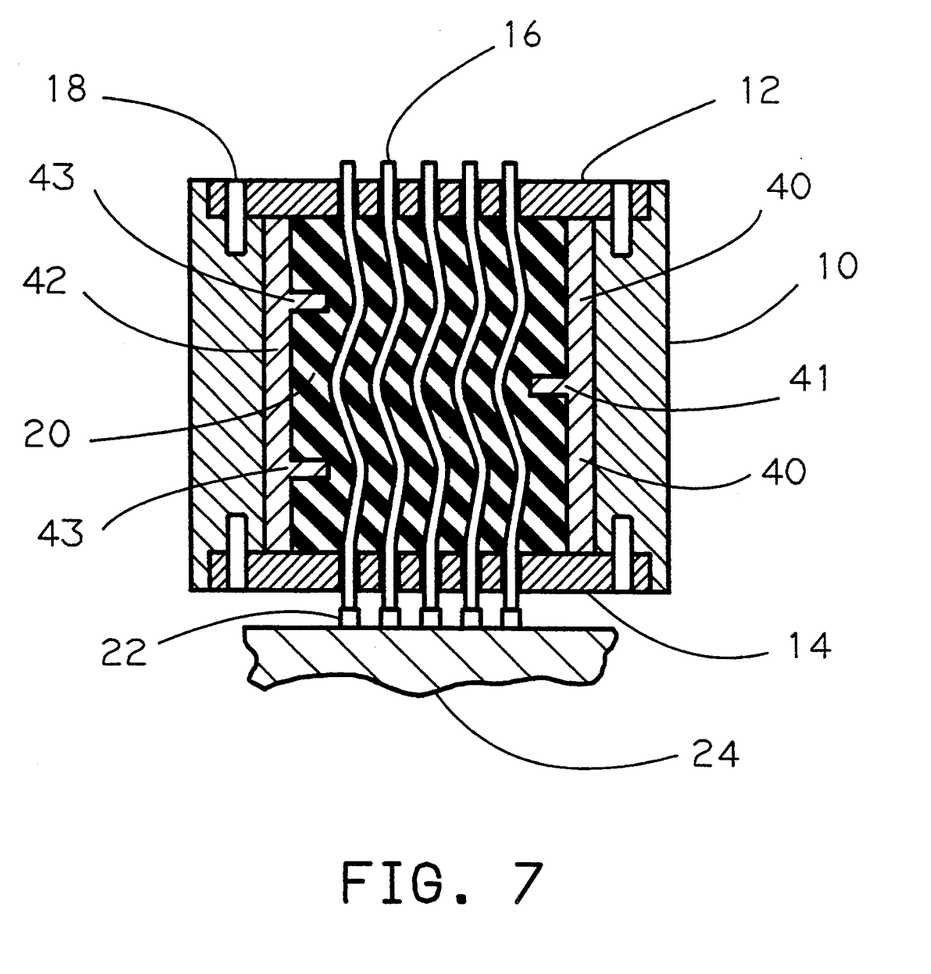
FIG. 7 shows how the probe wires buckle when the FIG. 6 embodiment presses against the contact pads.

If larger numbers of inflections are desired, these can be induced as well. FIG. 6 shows how plastic inserts 40 and 42 can be placed within housing 10 before encapsulation to provide projections 41 and 43 at natural inflection points adjacent the probes 16. Projections 41 and 43 reduce the amount of elastomer locally next to the probes and, thus, increase resistance there. When the probes contact the pads 22, they buckle away from the high resistance projections to assume the waveforms shown in FIG. 7.

Figure 8:
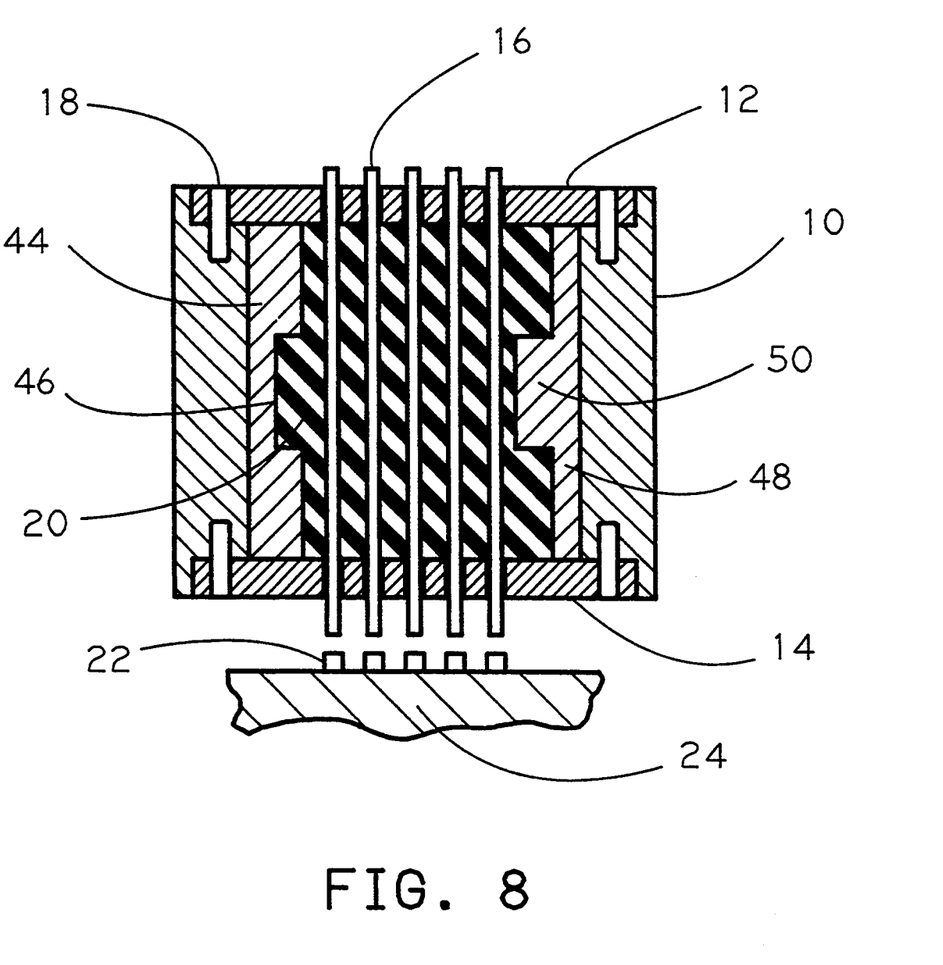
FIG. 8 shows another insert design, like FIG. 6.
Figure 9:
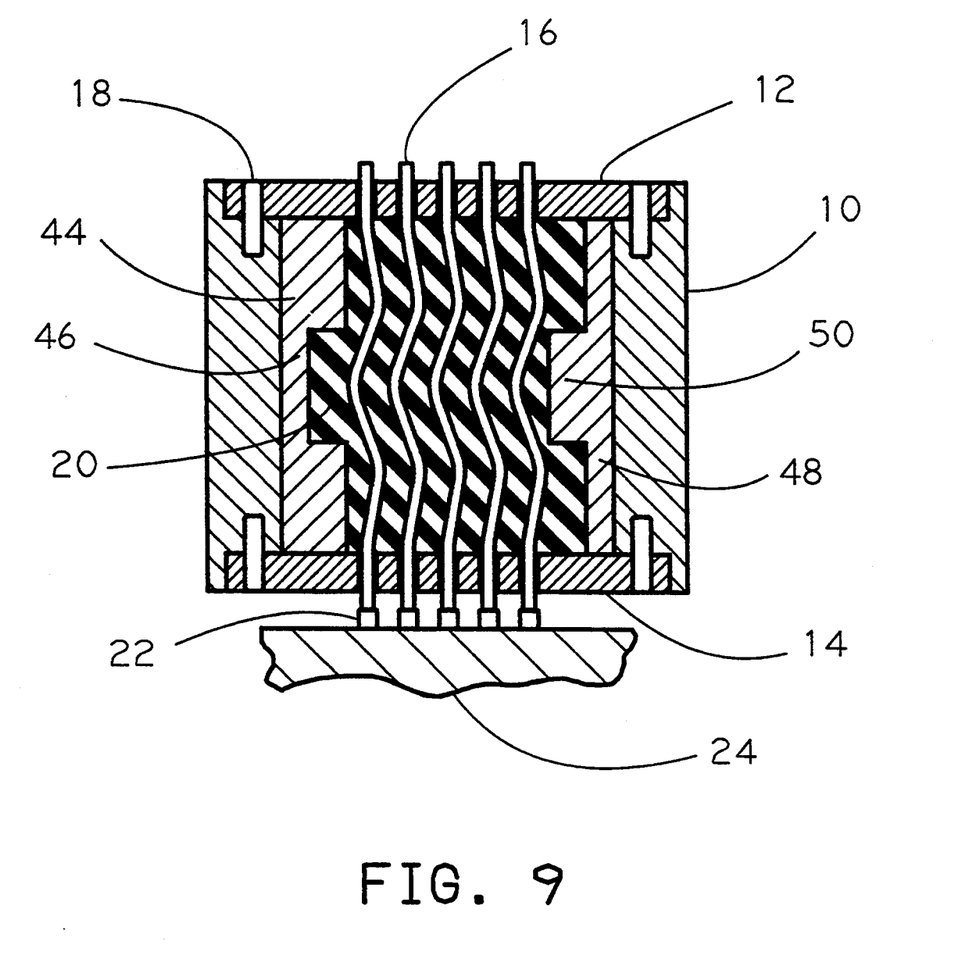
FIG. 9 shows the pattern of buckling that is induced by the FIG. 8 insert design.

FIG. 8 shows another embodiment in which an insert 44 has a recess 46 to hold more elastomer 20, and an insert 48 has a projection 50 to reduce the amount of elastomer. Under compression, bends such as diagrammed in FIG. 9 are induced in probes 16. Clearly, numerous variations are possible that do not depart from the spirit and scope of the inventive principles. Accordingly, limitation should be imposed only in conformance to the appended claims and their equivalents.

We claim:

1. An electrical probe contactor for making a plurality of electrical connections to contact pads on a device to be tested in which an array of individual probes is moved against a corresponding array of contact pads on the device and the probes are allowed to buckle transversely to the longitudinal axis of the probes in order to accommodate locational differences in the pads, comprising, in combination:
- an array of generally parallel, electrically conductive, probe wires disposed in a pattern corresponding to the pattern of the contact pads to be electrically engaged, each coupling wire having a first end and a second end;
- an elastic probe material disposed in a housing and encapsulating said probe wires to form an integrated elastic system so as axial force is applied to the ends of the probe wires, the force causes each wire to buckle with a plurality of transverse deflections and thereby induce other adjacent probe wires to buckle with a set of similar transverse deflections so that all probe wires bend and buckle in identical, parallel congruent wave forms, wherein said ends of the probe wires extending outwardly from top to bottom of the elastic coupling material for passing through plate means.

2. The probe contactor of claim 1 wherein said housing surrounds at least some portions of the encapsulated probes wires so as to restrain said elastic coupling material in those portions.

3. The probe contactor of claim 1 including guide plate means with holes therein through which said probe wires extend, the pattern of holes corresponding to the pattern of the contact pads.

4. The probe contactor of claim 2 including guide plate means mounted on said housing, said probe wires passing through holes in said guide plate means.

5. The probe contactor of claim 1 in which said coupling material comprises a castable dielectric elastomer.

6. The contactor of claim 5 in which said elastomer is formulated to be stiff enough to induce multiple inflections in the probe wires.

7. The contactor of claim 4 in which said coupling material comprises a castable dielectric elastomer.

8. The contactor of claim 7 in which said elastomer is stiff so as to generate a desired plurality of bends along the length of the probe wires.

9. The probe contactor of claim 7 in which the housing has an opening to eliminate restraint on the elastomer and induce deflection of the probe wires toward said opening.

10. The probe contactor of claim 7 in which additional volumes of elastomer are incorporated within said housing to induce buckling of said probe wires toward said volumes.

11. The probe contactor of claim 7 with voids in the elastomer to encourage bending of the probe wires toward said voids.

12. The probe contactor of claim 7 including inserts within said housing, said inserts being harder than said elastomer so as to decrease compressibility at selected locations and induce deflections of said probe wires away from said selected locations.

13. The probe contactor of claim 1 in which the ends of the probe wires extend past the top and bottom surfaces of the contactor.

14. An electrical probe contactor for making a plurality of electrical connections to contact pads on a device to be tested in which an array of individual probes is moved against a corresponding array of pads on the device and allowed to buckle transversely to the probes in order to accommodate locational differences in the pads, comprising, in combination:
- an array of generally parallel, electrically conductive, probe wires disposed in a pattern corresponding to the pattern of the contact pads to be electrically engaged;
- a hollow housing surrounding and enclosing the sides of said array Of probe wires;
- perforated plates attached to the top and bottom of said housing, with ends of said probe wires passing through the holes in the perforated plates so as to align with the contact pads; and
- an elastic, electrically insulating, castable elastomer compound disposed in said housing and surrounding said probe wires so as to form a composite elastic system in which the probe wires buckle only in matching, parallel, congruent wave forms, wherein said ends of the probe wires extend outwardly from top and bottom of the elastic, castable elastomer compound.

15. The contactor of claim 14 in which said elastomer compound comprises a silicone compound.

16. The contactor of claim 14 in which the elastomer compound is a urethane compound.

17. An electrical probe contactor for making a plurality of electrical connections to contact pads on a device to be tested in which an array of individual probes is moved against a corresponding array of contact pads on the device and allowed to buckle transversely to the longitudinal axis of the probes in order to accommodate locational differences in the pads, comprising, in combination:
- an array of generally parallel, electrically conductive, probe wires disposed in a pattern corresponding to the pattern of the contact pads to be electrically engaged;
- an elastic coupling material disposed in a housing and encapsulating said probe wires so as to transmit forces caused by transverse deflections of the probe wires to other probe wires and thereby induce other probe wires to buckle with a set of similar multiple transverse deflections so as to maintain separation between the probe wires, wherein ends of the probe wires extending outwardly from top and bottom of the elastic coupling material;
- said housing surrounding at least some portions of the encapsulated probes wire ends so as to restrain said elastic coupling material in those portions; and
- guide plate means mounted on said housing, said probe wires passing through holes in said guide plate means.

18. The probe contactor of claim 17 in which said coupling material comprises a castable dielectric elastomer.

19. The contactor of claim 18 in which said elastomer is formulated to be stiff enough to induce multiple inflections in the probe wires.

* * * * *